United States Patent [19]
Arena et al.

[11] Patent Number: 6,090,705
[45] Date of Patent: Jul. 18, 2000

[54] METHOD OF ELIMINATING EDGE EFFECT IN CHEMICAL VAPOR DEPOSITION OF A METAL

[75] Inventors: Chantal Arena, Mesa; Ronald T. Bertram, Phoenix, both of Ariz.; Emmanuel Guidotti, Barberaz, France; Joseph T. Hillman, Scottsdale, Ariz.

[73] Assignee: Tokyo Electron Limited, Tokyo, Japan

[21] Appl. No.: 09/009,387

[22] Filed: Jan. 20, 1998

[51] Int. Cl.[7] .............................. H01L 21/44; H05H 1/00; H05H 1/24
[52] U.S. Cl. .......................... 438/677; 438/680; 438/913; 427/535; 427/569
[58] Field of Search ...................................... 438/674, 677, 438/680, 763, 913; 427/535, 569

[56] References Cited

U.S. PATENT DOCUMENTS

| | | | |
|---|---|---|---|
| 5,023,206 | 6/1991 | Freeman | 438/723 |
| 5,273,775 | 12/1993 | Dyer | 427/99 |
| 5,380,566 | 1/1995 | Robertson | 427/534 |
| 5,482,749 | 1/1996 | Telford | 427/578 |
| 5,492,735 | 2/1996 | Saito | 427/569 |
| 5,510,297 | 4/1996 | Telford | 438/683 |
| 5,628,829 | 5/1997 | Foster et al. | 118/723 E |
| 5,806,980 | 9/1996 | Berrian | 374/179 |
| 5,899,752 | 4/1995 | Hey | 438/791 |
| 5,906,866 | 2/1997 | Webb | 427/534 |

FOREIGN PATENT DOCUMENTS

| | | |
|---|---|---|
| 0418592A1 | 3/1991 | European Pat. Off. . |
| 0430303A2 | 6/1991 | European Pat. Off. . |
| 0680072A2 | 11/1995 | European Pat. Off. . |

*Primary Examiner*—Charles Bowers
*Assistant Examiner*—Nema Berezny
*Attorney, Agent, or Firm*—Wood, Herron & Evans, L.L.P.

[57] ABSTRACT

A method of eliminating an edge effect in chemical vapor deposition of a metal such as copper on a semiconductor substrate surface. A susceptor in a reaction chamber is exposed to a plasma. A substrate contained thereon and processed by chemical vapor deposition has a uniform metal layer at edge and non-edge surfaces. A plurality of substrates may be processed before reexposing the susceptor to the plasma.

34 Claims, 1 Drawing Sheet

METHOD OF ELIMINATING EDGE EFFECT IN CHEMICAL VAPOR DEPOSITION OF A METAL

FIELD OF THE INVENTION

This invention relates generally to chemical vapor deposition (CVD) of a metal film on a semiconductor substrate, and more specifically to a method of eliminating an insufficiently thin deposit of a material such as copper at an edge of a substrate surface.

BACKGROUND OF THE INVENTION

In the formation of integrated circuits (IC), thin films containing metal and metalloid elements are often deposited upon the surface of a semiconductor substrate or wafer. Thin films provide conductive and ohmic contacts in the circuits and between the various devices of an IC. For example, a thin film of a desired metal might be applied to the exposed surface of a contact or via hole in a semiconductor substrate, with the film passing through the inculpative layers of the substrate to provide plugs of conductive material for the purpose of making interconnections across the insulating layers.

One well known process for depositing thin metal films is chemical vapor deposition (CVD), in which a thin film is deposited using chemical reactions between various deposition or reactant gases at the surface of the substrate. In CVD, reactant gases are brought into proximity to a substrate inside a vacuum reaction chamber, and the gases subsequently react at the substrate surface resulting in one or more products which form a film on the exposed substrate surface.

When copper is the metal film deposited onto a substrate by CVD, titanium nitride (TiN) is the common surface underlayer because of its high diffusion barrier strength. When the titanium component, that is, the titanium rich surface layer of TiN, is in its native metal form, a copper film is rapidly deposited on the substrate surface by CVD because the titanium metal provides free electrons needed for this electron transfer reaction. When the titanium component of the TiN is oxidized, or when the substrate surface is nitrogen rich, a copper film does not deposit until a nucleation layer of a copper metal precursor forms on the substrate surface. The lag time while the nucleation layer forms, also called the incubation time, is unproductive because copper cannot deposit on the oxidized substrate surface until the nucleation layer forms.

The probability of copper precursor molecules finding a stable site on the substrate surface on which to deposit is referred to as its "sticking coefficient." The copper sticking coefficient is only about 1% when the substrate surface is TiN, while it increases to about 100% when the substrate surface is covered by a fresh copper film.

A common problem in copper deposition on a substrate by CVD is the so-called "edge effect." The edge effect is defined as occurring when the edge of the substrate gets less copper deposited or no copper deposited compared to the non-edge regions of the substrate. The edge effect is the result of the difference of materials on the susceptor, mainly fresh copper from previous depositions, and the substrate itself, mainly an oxidized form of a metallic layer. The sticking coefficient of the reactant precursor is 100% on the susceptor and much less on the substrate. Therefore the susceptor will consume more reactant than the substrate, thus creating a reactant-depleted zone in the vicinity of the substrate edge. By lack of precursor as well as low sticking coefficient, the edge of the substrate will suffer a longer incubation time. The longer incubation time translates into less deposition of a metal in the vicinity of an edge than in the inner part of the wafer or substrate.

It has been observed that the first substrate processed on a new oxidized susceptor does not exhibit an edge effect. This result has led to the common practice of using a new oxidized susceptor for each deposition of copper. This practice, however, is both inefficient and costly for commercial semiconductor production. Eliminating the edge effect would increase the rate at which a metal film is deposited on a substrate surface edge, which in turn would decrease the incubation time at an edge. The result would be increased efficiency of semiconductor substrate production. A commercially feasible method to eliminate an edge effect in semiconductor substrate production is therefore needed.

SUMMARY OF THE INVENTION

To this end, and in accordance with the principles of the present invention, it is one object of the present invention to provide a method of eliminating an edge effect in metal CVD on a semiconductor substrate.

It is a further object of the present invention to eliminate an edge effect in metal CVD on a semiconductor substrate without utilizing a new susceptor for each deposition.

It is a still further object of the present invention to provide a semiconductor substrate that has a metal film coating of substantially uniform thickness on all substrate surface areas.

It is a still further object of the present invention to provide a method of eliminating an edge effect in copper CVD without utilizing a new susceptor for each deposition and providing a semiconductor substrate that has a copper film coating of substantially uniform thickness on all substrate surface areas.

Specifically, this invention is directed to a method of eliminating an edge effect on a semiconductor substrate surface. More specifically, the invention is directed to a method of eliminating the deposit of an insufficiently thin film of a metal or metalloid element in the vicinity of the edge of a semiconductor substrate during chemical vapor deposition.

According to the principles of the present invention, a method of depositing a uniform metal film on a substrate is provided. The method includes the step of exposing a susceptor to a plasma prior to depositing a film by chemical vapor deposition.

According to certain aspects of the present invention, the susceptor is exposed to the plasma before a substrate is placed on the susceptor for metal deposition. In other aspects of the present invention, a susceptor supporting a substrate thereon is exposed to the plasma, and a film is subsequently deposited by chemical vapor deposition.

According to further aspects of the present invention, the susceptor is exposed to a plasma prior to the successive placement and film coating of a plurality of substrates. After treatment of the plurality of substrates, the susceptor is preferably again exposed to the plasma and another plurality of substrates is then successively placed on the susceptor and coated. The ratio of successive substrate treatments to susceptor treatment is preferably 3 or more substrates treated to 1 susceptor treated.

According to still further aspects of the present invention, the susceptor alone or susceptor supporting a substrate is exposed to a hydrogen/argon plasma in a vacuum reaction chamber under a pressure of about 0.1 to 25 torr, a power of about 50 to 1500 W, a frequency of about 250 to 500 KHz, a hydrogen flow rate of about 10 to 5000 sccm and an argon flow rate of about 10 to 1500 sccm, for about 2 to 240 seconds at a temperature of about 120 to 700° C., with the hydrogen/argon plasma being initiated by a radio frequency generator attached to a showerhead in the reaction chamber. Exposure may occur either before a substrate is supported on a susceptor for copper CVD or any other metal CVD, or after a substrate is supported on a susceptor.

By virtue of the foregoing, there is thus provided a method of eliminating an edge effect in a substrate subject to metal CVD by exposing a susceptor or a susceptor supporting a substrate to a plasma. Preferably, a method of eliminating an edge effect in a substrate subject to copper CVD by exposing a susceptor, or a susceptor supporting a substrate, to a hydrogen/argon plasma is provided. These and other objects and advantages of the present invention shall be made apparent from the accompanying drawings and description thereof.

DETAILED DESCRIPTION OF THE DRAWINGS

Figure 1:
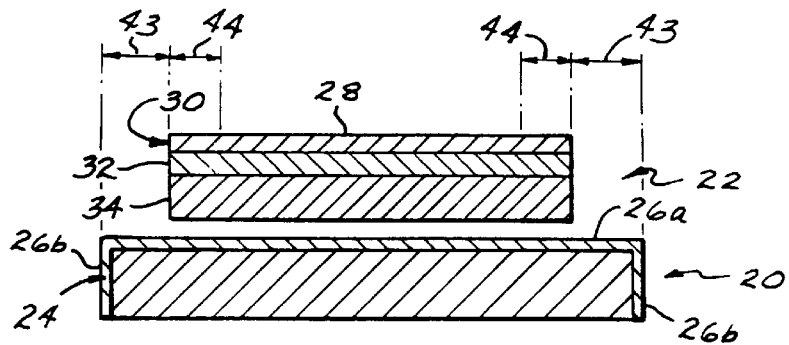
FIG. 1 is a schematic of a susceptor and a substrate.

With reference to FIG. 1, a susceptor 20 for supporting a semiconductor substrate 22, and a substrate 22 to be supported during copper CVD is shown. A typical susceptor 20 has a native oxide layer 24 on its top 26a and side 26b surfaces. A substrate 22 has as its top surface 28 a native oxide layer 30 that is about 10 Å to about 20 Å thick. This top layer 30 is, in turn, on top of a TiN layer 32 that is about 500 Å thick which, in turn, is on top of a silicon base 34.

The substrate 22 has edge regions 44, defined as zones of the substrate 22 in the vicinity of the edge that become reactant depleted during subsequent CVD of copper or another metal. The remaining region of the substrate 22, defined as the region of the substrate 22 not including the edge regions 44, does not become reactant depleted during subsequent CVD of copper or another metal.

Figure 2:
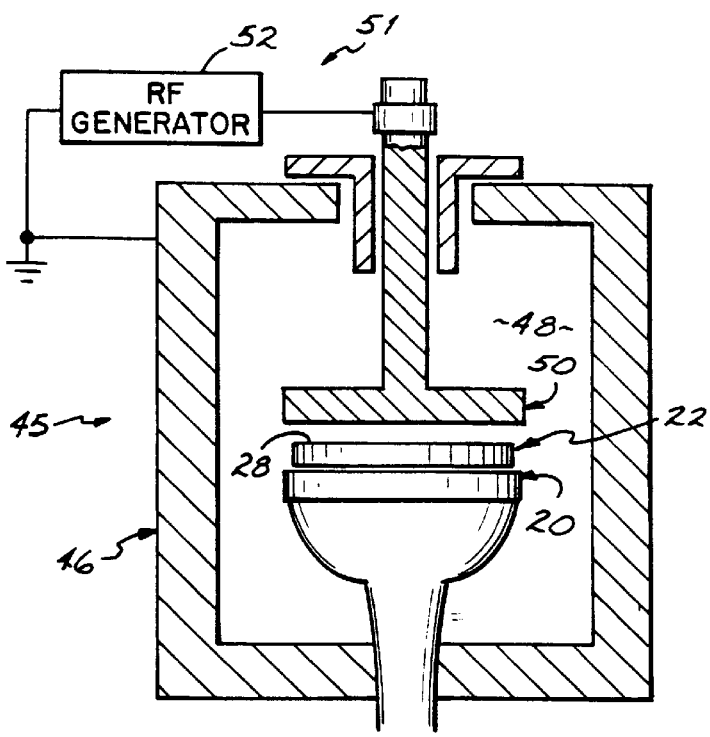
FIG. 2 is a schematic cross-sectional view of a reaction chamber for copper CVD.

With reference to FIG. 2, a reactor 45 used for copper deposition on the surface 28 of a semiconductor substrate 22 by CVD is illustrated. The reactor 45 includes a reaction chamber 46 which encloses a processing space 48. In the reaction chamber 46, which is shown as containing a substrate 22 on a susceptor 20, reactant gases for CVD are delivered to a processing space 48. A gas delivery system, such as the system described in U.S. Pat. No. 5,628,829 METHOD AND APPARATUS FOR LOW TEMPERATURE DEPOSITION OF CVD AND PECVD REACTIONS, which is assigned to the Assignee of the present invention and is hereby specifically incorporated in its entirety by reference, provides the proper flow and distribution of the gases for the CVD process. Generally, gas delivery systems contain gas-dispersing elements, such as a flat showerhead 50, in the reaction chamber 46. The showerhead 50 spreads the entering reactant gases around the processing space 48 of the reaction chamber 46 to ensure a uniform distribution and flow of the gases proximate the susceptor 20 and substrate 22. Uniform gas distribution and flow is desirable for a uniform and efficient deposition process, a dense plasma, and a uniformly deposited film.

According to one embodiment of the present invention, the reactor 45 is equipped with a plasma producing apparatus 51 for exposing the susceptor 20 to a hydrogen/argon plasma either prior or subsequent to placing of the substrate 22 thereon for processing. The apparatus 51 to expose the susceptor 20 to the hydrogen/argon plasma may be the type described in co-pending U.S. Pat. application Ser. No. 08/797,397 filed Feb. 10, 1997 and entitled PROCESS FOR CHEMICAL VAPOR DEPOSITION FOR TUNGSTEN ONTO A TITANIUM NITRIDE SUBSTRATE SURFACE, which is assigned to the Assignee of the present invention and is expressly incorporated herein by reference. The apparatus 51 preferably includes a radiofrequency (RF) generator 52, capable of generating 450 KHz, which is attached to the showerhead 50.

Figure 3:
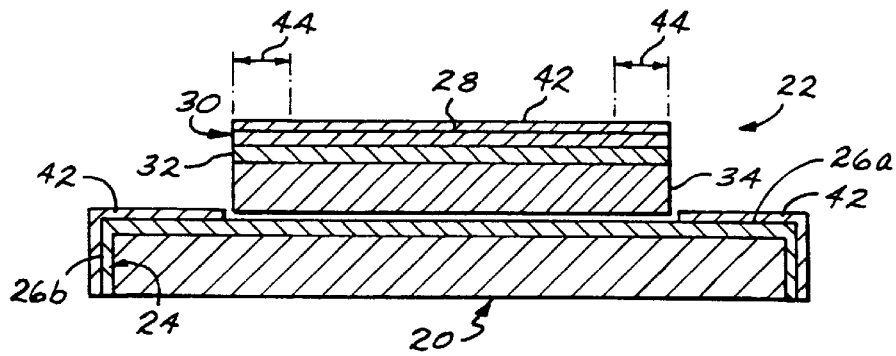
FIG. 3 is a schematic of a susceptor supporting a substrate after copper deposition by the method of the invention.

FIG. 3 shows a susceptor 20 and substrate 22 after a deposit of a copper film by CVD using the method of the invention. For copper film deposition a copper precursor, copper$^I$ hexafluoroacetylacetonate trimethylvinylsilane (Cu$^I$ (hfac) (tmvs)), is used. The tmvs ligand stabilizes the precursor during its vaporization stage, and the hfac ligand activates the precursor toward a higher metallization rate at the substrate surface. Two molecules of Cu$^I$ (hfac) (tmvs) react to generate copper metal (Cu°) and by-products in the following disproportionation reaction:

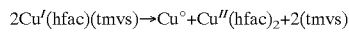

$$2Cu^I(hfac)(tmvs) \rightarrow Cu° + Cu^{II}(hfac)_2 + 2(tmvs)$$

Typical conditions in a vacuum reaction chamber 46 for copper CVD are: substrate 22 temperature of about 120° C. to 280° C., reaction pressure of about 0.5 torr to about 2.0 torr, precursor flow rate of about 0.2 ml/min to about 1.0 ml/min of liquid (equivalent to about 16–80 sccm of vapor), and diluent flow of about 100 sccm.

After an incubation time, during which a continuous nucleation layer forms on each of the oxide metal surfaces 26a, 26b of the susceptor 20, copper deposits on the susceptor 20 at a constant rate. The result is a fresh copper metal surface 42 on the native oxide surface 24 of a susceptor 20. In copper depositions onto substrates 22 subsequently supported on the susceptor 20, deposition begins immediately on the fresh copper surface 42 of the susceptor 20.

Copper deposition cannot begin on the substrate 22, however, until a nucleation layer has formed. The sticking coefficient for the copper precursor on the native oxide layer 30 of the uppermost surface 28 of the substrate 22 is on the order of 1%, while the sticking coefficient for the copper precursor on the fresh copper film 42 on the susceptor 20 is nearly 100%. Copper precursor adsorbed on the substrate 22 in the vicinity of its edge regions 44 has only a 1% chance of sticking, while copper precursor adsorbed on the susceptor 20 in the regions defined as 43, has a 100% chance of sticking and are regions of heavy consumption of the reactant. The difference in sticking coefficients is commonly accepted as the cause for the edge effect, which leads to depletion of copper precursor near the substrate edge regions 44. Since there is less copper precursor near the substrate edge regions 44 to form the nucleation layer, the incubation time near the edge regions 44 is extended.

In the method of the present invention, exposing a susceptor 20 containing a copper film 42 on a plurality of surfaces 26a, 26b to a hydrogen/argon plasma eliminates an insufficiently thin copper film from forming at the edge regions of a substrate 44 and allows a uniform copper film 42 to form on the substrate 22. Additionally, in the method of the present invention, a single exposure of the susceptor 20 containing a copper film 42 on a plurality of surfaces 26a, 26b to a hydrogen/argon plasma eliminates an insufficiently thin copper film from forming at the edge regions 44 of a plurality of subsequently processed substrates 22 and allows a uniform copper film 42 to form on the plurality of substrates 22. Exposing the susceptor 20 containing a copper film 42 to the plasma reconditions, but does not remove, the film 42. The susceptor 20 is therefore not cleaned by plasma exposure, since the film 42 remains on the surface.

Also in the method of the present invention, exposing a susceptor 20 having a substrate 22 supported thereon to a hydrogen/argon plasma eliminates an insufficiently thin copper or other metal film from forming at the edge regions a substrate 22. It is believed that exposing the TiN surface of the substrate 22 to the hydrogen/argon plasma modifies the surface of the substrate 22, rendering it Ti rich rather than N rich. A surface rich in the metal Ti component, versus a surface rich in the non-metal N component, behaves more like a native metal surface and provides sufficient free electrons needed for the electron transfer copper or other metal CVD reaction.

In use, the susceptor 20 is exposed to a hydrogen/argon plasma under the following preferred reaction chamber 46 conditions: a pressure of about 0.1 to 25 torr, a power of about 50–1500 W, a frequency of about 250–500 KHz, a hydrogen flow of about 10–5000 sccm, an argon flow of about 10–1500 sccm, a susceptor temperature of about 120–700° C., and a time of approximately 2–240 seconds.

When substrates 22 are treated by a hydrogen/argon plasma, the first few substrates 22 have copper deposited thereon do not exhibit the edge effect. These first few substrates 22 develop uniformly thick copper coatings extending to the substrate edge regions 44. Two possible mechanisms may explain these observations. First, the hydrogen/argon plasma might somehow be lowering the sticking coefficient for the copper precursor molecule on the copper surface 42 of the susceptor 20. This would cause the native oxide layer 30 on the top substrate surface 28, and the hydrogen/argon-treated copper surface 42 of the susceptor 20, to have the same non-zero incubation time. Second, it is possible that the edge effect might be caused by some reaction by-product that sticks to the copper surface 42 on the susceptor 20, and then poisons the deposition around the edge regions 44 of a subsequent substrate 22. If this is the case, then the hydrogen/argon plasma might be chemically reducing the by-product, thereby eliminating the poisoning. For example, Cu$^{II}$(hfac) is very likely to be an intermediate reaction by-product. This is a very active molecule and would readily adhere to a surface, blocking potential nucleation sites. The hydrogen/argon plasma would reduce this molecule by the following mechanism:

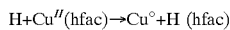

H+Cu$^{II}$(hfac)→Cu$^{o}$+H (hfac)

Although these are examples of two possible mechanisms for eliminating an edge effect, other mechanisms or even a combination of mechanisms may also be possible. This invention is not so limited to the two possible mechanisms described herein.

While the present invention has been illustrated by description of embodiments, and while the illustrative embodiments have been described in considerable detail, it is not the intention of the inventors to restrict or in any way limit the scope of the appended claims to such detail. Additional advantages and modifications will readily appear to those skilled in the art. For example, the specific conditions under which the susceptor is exposed to the plasma may be varied depending upon the metal film deposited. As another example, multiple layers of a metal film may be deposited to achieve a uniformly thick film with a smooth surface and low resistivity. As still another example, a metal film other than copper and using a plasma other than hydrogen/argon may be deposited by the disclosed method. The invention in its broader aspects is therefore not limited to the specific details, representative apparatus and methods, and illustrative examples shown and described. Accordingly, departures may be made from such details without departing from the spirit or scope of applicants' general inventive concept.

Having described the invention, what is claimed is:

1. A method of eliminating an edge effect in chemical vapor deposition of a metal on a semiconductor substrate surface, comprising the step of:

providing a susceptor for supporting a substrate, said susceptor having a depositing surface including a film comprising said metal to be chemically vapor deposited on said substrate surface; and exposing said depositing surface to a plasma treatment to recondition said film on said depositing surface before chemical vapor deposition to thereby eliminate said edge effect of said metal deposited onto the substrate supported thereon.

2. The method of claim 1, the exposing step comprising the step of exposing the susceptor having said film formed on a native oxide layer on at least one surface to the plasma.

3. The method of claim 2, the exposing step comprising the step of exposing the susceptor having said film formed on a native oxide layer in the range of between about 10 Å thick to about 20 Å thick to the plasma.

4. The method of claim 1, the exposing step comprising exposing a susceptor to a hydrogen/argon plasma prior to a copper chemical vapor deposition onto the substrate.

5. The method of claim 4, the exposing step being performed in a reaction chamber under a pressure in the range of about 0.1–25 torr, and preferably about 1 torr.

6. The method of claim 4, the exposing step being performed in a reaction chamber at a power in the range of about 50–1500 W, and preferably about 750 W.

7. The method of claim 4, the exposing step being performed in a reaction chamber at a frequency in the range of about 250–500 KHz, and preferably about 450 KHz.

8. The method of claim 4, the exposing step being performed in a reaction chamber under a hydrogen flow in the range of about 50–5000 sccm, and preferably about 200 sccm.

9. The method of claim 4, the exposing step being performed in a reaction chamber under an argon flow in the range of about 10–1500 sccm, and preferably about 50 sccm.

10. The method of claim 4, the exposing step being performed in a reaction chamber at a susceptor temperature in the range of about 120° C.–700° C., and preferably about 180° C.

11. The method of claim 4, the exposing step being performed in a reaction chamber for a time in the range of about 2–240 seconds, and preferably about 20 seconds.

12. The method of claim 1, the exposing step including the step of exposing a susceptor having a substrate supported thereon, said substrate having a silicon base layer, a TiN middle layer, and a native oxide top layer, to the plasma.

13. The method of claim 12, the exposing step including the step of exposing a substrate having a silicon base layer, a TiN middle layer having a thickness of about 500 Å, and a native oxide top layer, to the plasma.

14. The method of claim 12, the exposing step including the step of exposing a substrate having a silicon base layer, a TIN middle layer, and a native oxide top layer having a thickness about 10 Å, to about 20 Å, to the plasma.

15. The method of claim 12, the exposing step including the step of exposing a substrate having a silicon base layer, a TiN middle layer, and a native oxide top layer to the plasma, the plasma being initiated by a radiofrequency generator attached to a showerhead through which the plasma is dispensed toward the substrate.

16. A method of manufacturing a semiconductor, comprising the steps of:
   (a) exposing a susceptor with a metal film deposited thereon to a plasma treatment to recondition a depositing surface;
   (b) loading a substrate onto the susceptor;
   (c) depositing a metal film on the substrate, being supported on the susceptor, by chemical vapor deposition;
   (d) repeating steps (b) through (c) a plurality of times before reexposing the susceptor to the plasma; and
   (e) repeating steps (a) through (d) until a desired number of substrates are processed; the desired number of substrates containing a substantially uniform metal film.

17. The method of claim 16, wherein steps (b) and (c) are repeated more than once, and preferably more than twice, before reexposure of the susceptor to the plasma.

18. The method of claim 16, the exposing step comprising exposing a susceptor to a hydrogen/argon plasma and the depositing step comprising depositing a copper film on the substrate.

19. A method of eliminating an edge effect in a semiconductor substrate surface in copper chemical vapor deposition, comprising:
   exposing a susceptor, having a copper film on a depositing surface thereof, in a reaction chamber to a pressure of about 1 torr, a power of about 750 W, a frequency of about 450 KHz, a hydrogen flow of about 200 sccm, an argon flow of about 50 sccm, a susceptor temperature of about 180° C., and a time of approximately 20 seconds, to recondition the copper film prior to loading a substrate onto the susceptor for copper chemical vapor deposition.

20. The method of claim 19, the exposing step occurring with the susceptor supporting a substrate.

21. A method of manufacturing a semiconductor, comprising the steps of:
   exposing a susceptor to a plasma treatment to recondition a metal film on a depositing surface of the susceptor and to thereby eliminate an edge effect of a metal film on a substrate; and
   coating a plurality of substrates with a substantially uniform metal film by chemical vapor deposition; the plurality of the substrates being coated before again performing the exposing step on the susceptor.

22. The method of claim 21, the exposing step occurring with the susceptor supporting a substrate.

23. The method of claim 21, the exposing step including exposing a susceptor to a hydrogen/argon plasma and the coating step including coating with a substantially uniform copper film by chemical vapor deposition.

24. A method of manufacturing a semiconductor, comprising the steps of:
   (a) depositing a metal film on a surface of a susceptor;
   (b) exposing the susceptor to a plasma treatment to recondition the metal film on the surface and to thereby eliminate an edge effect of a metal film on a substrate;
   (c) loading a substrate on the susceptor; and
   (d) depositing a metal film on the substrate by chemical vapor deposition; the substrate containing a substantially uniform metal film at an edge and a non-edge surface.

25. The method of claim 24, the exposing step occurring with the susceptor supporting a substrate.

26. The method of claim 24, the exposing step comprising exposing the susceptor to a hydrogen/argon plasma and the depositing step comprising depositing a copper film on the substrate by chemical vapor deposition.

27. The product of the method of claim 1, the metal deposited onto the substrate being substantially the same thickness at an edge and a non-edge surface of the substrate.

28. The product of the method of claim 16, the metal film on the substrate being substantially the same thickness at an edge and a non-edge surface of the substrate.

29. The product of the method of claim 19, the copper chemical vapor deposited on the substrate being substantially the same thickness at an edge and a non-edge surface of the substrate.

30. The product of the method of claim 21, the metal film on the substrate being substantially the same thickness at an edge and a non-edge surface of the substrate.

31. The product of the method of claim 24, the metal film on the substrate being substantially the same thickness at an edge and a non-edge surface of the substrate.

32. A method of eliminating an edge effect in chemical vapor deposition of a metal on a semiconductor substrate surface supported on a susceptor, comprising exposing a metal film on a depositing surface to a plasma treatment to recondition said depositing surface prior to chemical vapor deposition onto the substrate.

33. The method of claim 32 wherein the depositing surface is a susceptor.

34. The method of claim 33 wherein said susceptor has a substrate supported thereon.

* * * * *

UNITED STATES PATENT AND TRADEMARK OFFICE
CERTIFICATE OF CORRECTION

PATENT NO.   : 6,090,705
DATED        : July 18, 2000
INVENTOR(S)  : Chantal Arena, Ronald T. Bertram, Emmanuel Guidotti, and Joseph T. Hillman It is certified that error appears in the above-identified patent and that said Letters Patent is hereby corrected as shown below:

Column 6,
Line 45, please delete "scem" and replace with -- sccm --;
Line 66, please delete "TIN" and replace with -- TiN --.

Signed and Sealed this

Twenty-eighth Day of August, 2001

Attest:

NICHOLAS P. GODICI
Attesting Officer    Acting Director of the United States Patent and Trademark Office